United States Patent
Riboloff

[19]

[11] Patent Number: 6,111,968
[45] Date of Patent: *Aug. 29, 2000

[54] SOUND PRODUCTION APPARATUS

[75] Inventor: John T. Riboloff, Antioch, Tenn.

[73] Assignee: Gibson Guitar Corp., Nashville, Tenn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/889,235

[22] Filed: Jul. 8, 1997

[51] Int. Cl.$^7$ ........................................ H04R 1/02
[52] U.S. Cl. .......................... 381/332; 381/118; 381/120; 381/334
[58] Field of Search .............................. 381/61, 118, 120, 381/98, 334, 336, 332

[56] References Cited

U.S. PATENT DOCUMENTS

| | | |
|---|---|---|
| Re. 33,333 | 9/1990 | Taylor, Jr. et al. . |
| 1,993,859 | 3/1935 | Roberts . |
| 2,026,495 | 12/1935 | Curtis . |
| 2,148,030 | 2/1939 | McLennan . |
| 2,257,840 | 10/1941 | Dubilier . |
| 2,396,691 | 3/1946 | Galbreath . |
| 2,695,337 | 11/1954 | Burwen . |
| 2,761,921 | 9/1956 | Kuhl . |
| 2,783,457 | 2/1957 | Flanagan . |
| 2,812,382 | 11/1957 | Michael ................................. 381/334 |
| 2,817,708 | 12/1957 | Fender . |
| 2,973,681 | 3/1961 | Fender . |
| 3,473,625 | 10/1969 | Heisrath ................................. 381/336 |
| 4,164,163 | 8/1979 | Rhodes . |
| 4,211,893 | 7/1980 | Smith . |
| 4,349,788 | 9/1982 | Sondermeyer . |
| 4,382,398 | 5/1983 | O'Neill . |
| 4,405,832 | 9/1983 | Sondermeyer . |
| 4,439,742 | 3/1984 | Sondermeyer . |
| 4,532,476 | 7/1985 | Smith . |
| 4,593,251 | 6/1986 | Smith . |
| 4,600,891 | 7/1986 | Taylor, Jr. et al. . |
| 4,611,300 | 9/1986 | Taylor, Jr. et al. . |
| 4,701,957 | 10/1987 | Smith . |
| 4,713,624 | 12/1987 | Smith . |
| 4,724,396 | 2/1988 | Taylor, Jr. et al. . |
| 4,811,401 | 3/1989 | Brown, Sr. et al. . |
| 4,818,951 | 4/1989 | Roberts . |
| 4,890,331 | 12/1989 | Brown, Sr. et al. . |
| 4,953,222 | 8/1990 | Roberts . |
| 4,992,751 | 2/1991 | Attwood et al. . |
| 5,023,915 | 6/1991 | Brown, Sr. et al. . |
| 5,091,700 | 2/1992 | Smith . |
| 5,119,426 | 6/1992 | Roberts . |
| 5,119,430 | 6/1992 | Peavey et al. . |
| 5,127,059 | 6/1992 | Elion et al. . |

(List continued on next page.)

*Primary Examiner*—Ping Lee
*Attorney, Agent, or Firm*—McAfee & Taft

[57] ABSTRACT

A sound production apparatus has a speaker, an amplifier circuit that includes at least one electron tube, and a portable housing that encloses the speaker and contains the amplifier circuit such that the speaker is fully enclosed within the housing. In a particular implementation the amplifier circuit includes an input connector, a first triode connected to the input connector, a gain adjustment variable resistance connected to the first triode, and a second triode, which second triode is connected to the gain adjustment variable resistance. A tone adjustment section has a treble tone adjustment variable resistance, a bass tone adjustment variable resistance, and a midrange adjustment variable resistance, all connected to the second triode. A volume adjustment variable resistance is connected to the tone adjustment section, a pentode is connected to the volume adjustment variable resistance, and a transformer is connected to the pentode. A chassis on which the amplifier circuit is mounted forms part of a back wall enclosing the speaker, and the triodes and pentode are mounted to the chassis such that they are on the outside of the back wall but the remainder of the amplifier circuit is on the inside of the back wall. Particular resistors and capacitors used in the amplifier circuit enable sufficient amplification without losing musical quality of the amplified signal.

16 Claims, 5 Drawing Sheets

U.S. PATENT DOCUMENTS

| | | |
|---|---|---|
| 5,131,044 | 7/1992 | Brown, Sr. et al. . |
| 5,168,438 | 12/1992 | Smith ........................................ 363/67 |
| 5,197,102 | 3/1993 | Sondermeyer . |
| 5,208,548 | 5/1993 | Van Riezen . |
| 5,387,876 | 2/1995 | Sondermeyer . |
| 5,509,080 | 4/1996 | Roberts . |
| 5,524,055 | 6/1996 | Sondermeyer . |
| 5,559,469 | 9/1996 | Smith . |

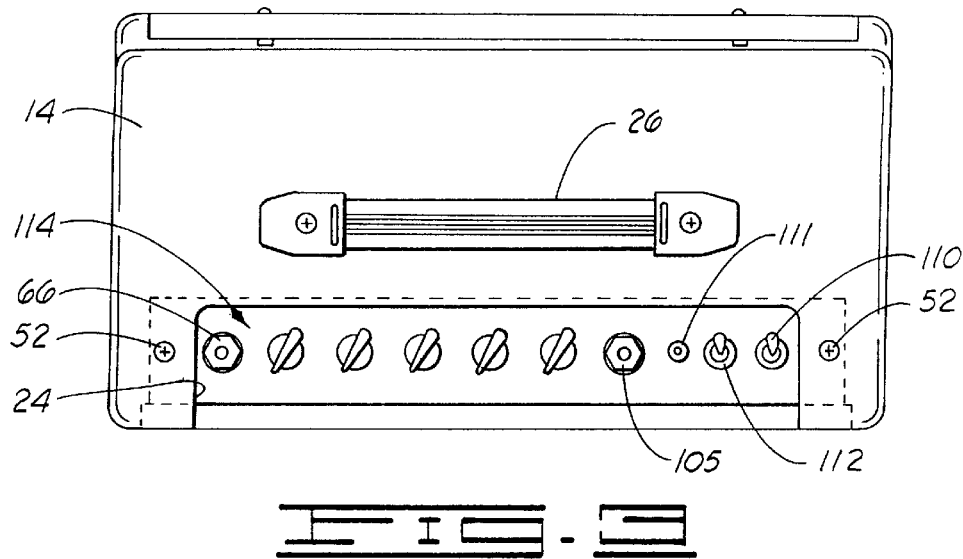
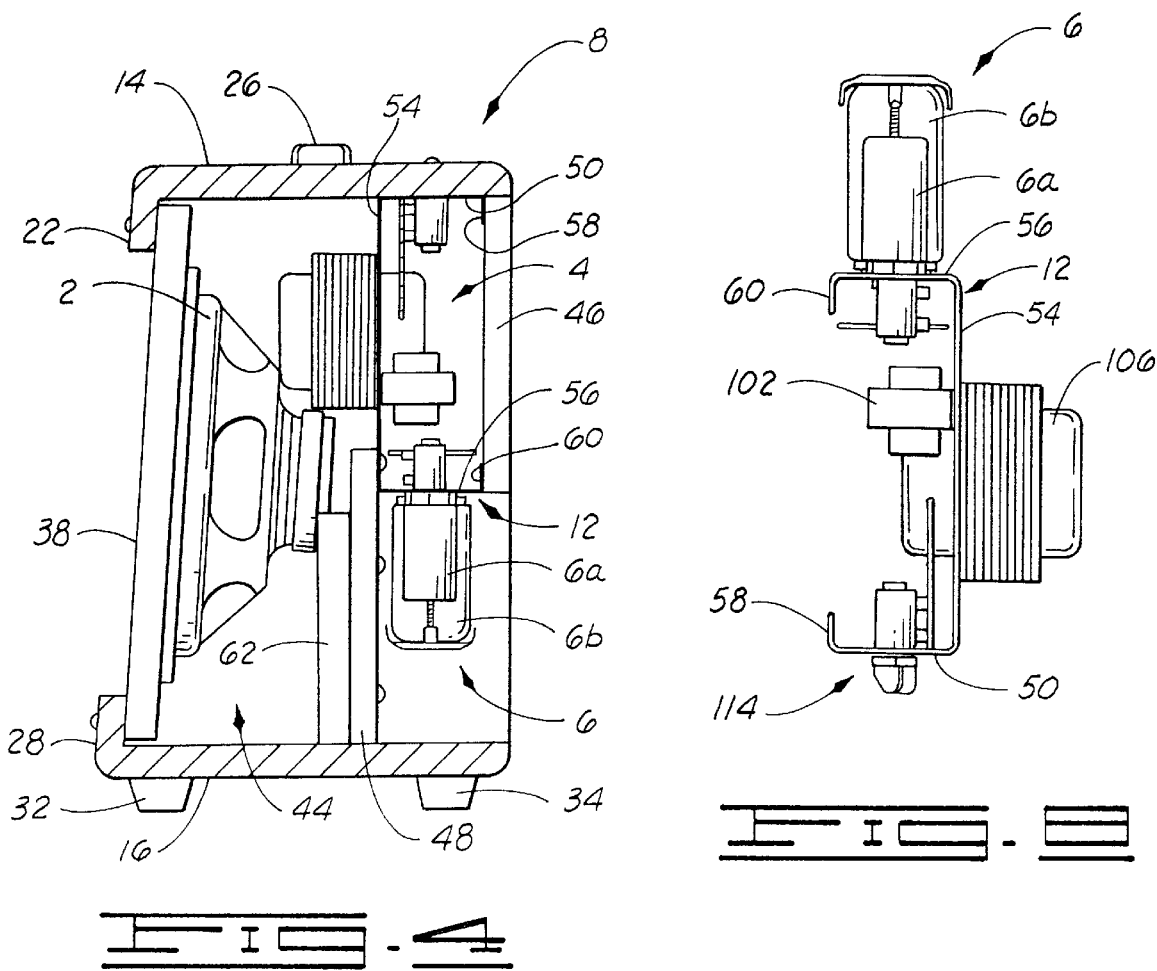

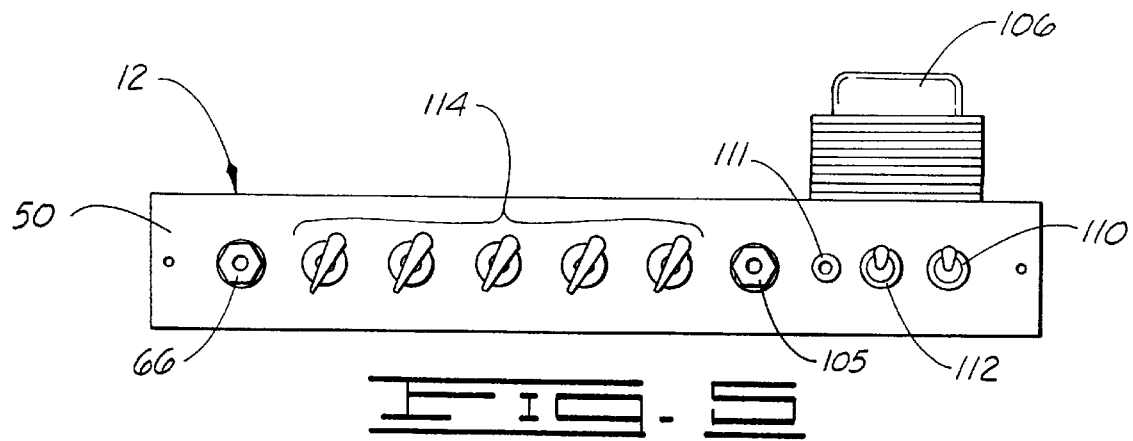
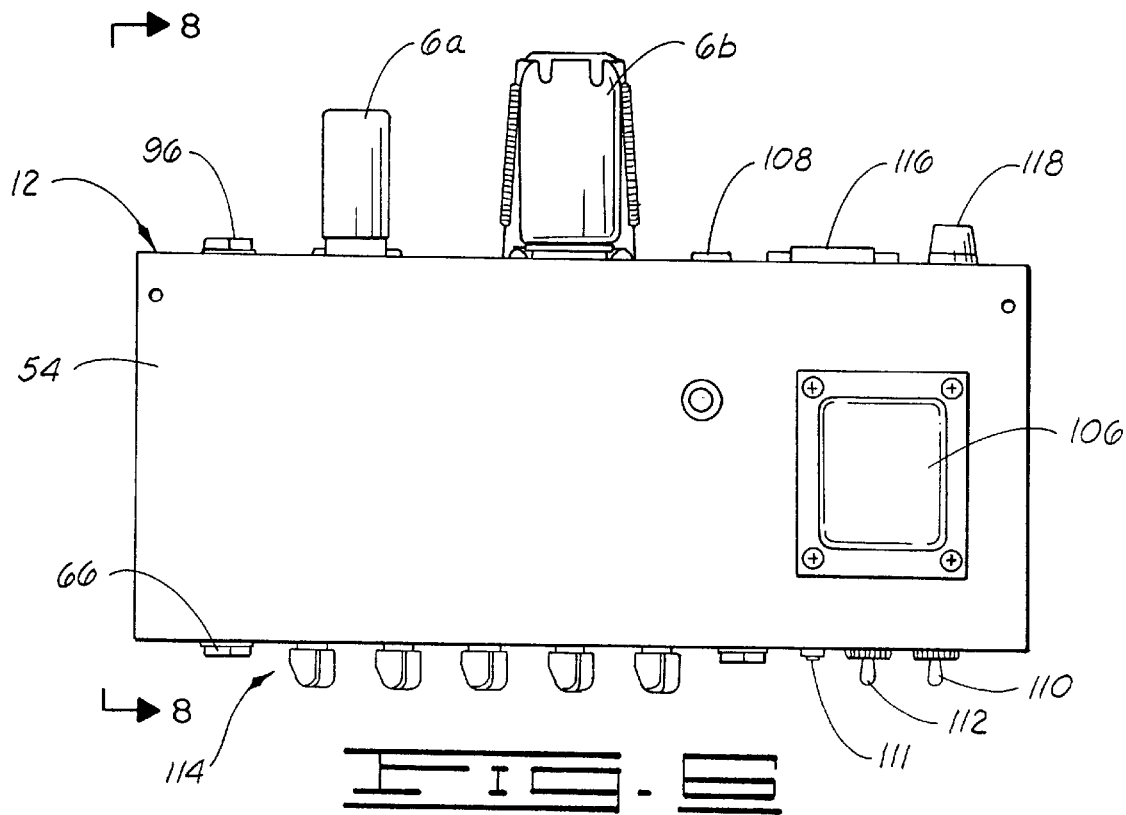
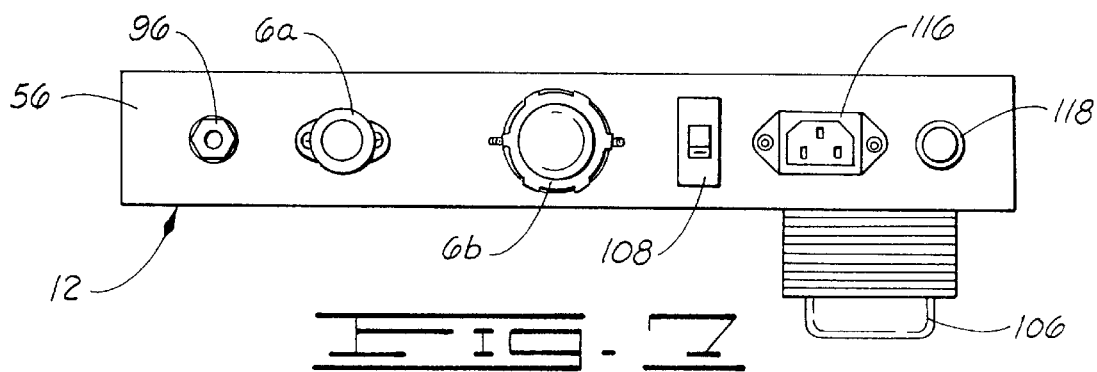

6,111,968

SOUND PRODUCTION APPARATUS

BACKGROUND OF THE INVENTION

This invention relates generally to sound production apparatus and more particularly, but not by way of limitation, to a loudspeaker and tube amplifier system. One particular implementation of this is as a portable guitar amplifier of the type which includes a speaker, an electronic tube amplifier circuit, and a cabinet housing the speaker and circuit.

The cabinets of prior sound production apparatus to which the present invention relates are typically open at the back to allow adequate air flow to keep the tubes from overheating. Such open back, however, allows some of the sound energy from the speaker to be lost out the back. If the back could be closed, much of this energy would be redirected out the front of the apparatus and provide smoother tonality in the low end of the output sound. Thus, there is the need for a sound production apparatus which has an enclosed back but which does not thereby cause overheating damage to the electronics of the apparatus.

A particular implementation of the electronic tube amplifier circuit to which the present invention pertains is specifically a class A electron tube amplifier having two triodes and one pentode. This is typically implemented as a relatively small amplifier with limited player control capability. It would be desirable to provide a simple type of tube amplifier that has enhanced control. Such control should be enabled to allow sufficient amplification without diminishing the musical quality of the signal processed through the amplifier for broadcast through the speaker connected to the circuit.

SUMMARY OF THE INVENTION

The present invention overcomes the above-noted and other shortcomings of the prior art, and meets the aforementioned needs, by providing a novel and improved sound production apparatus. The apparatus has a cabinet with a closed back, and the apparatus provides individual control of at least gain, treble, bass, midrange, and volume in a relatively simple electron tube amplifier circuit. A particular feature of the enclosed cabinet is that it uses a portion of the chassis on which the amplifier circuit is mounted.

One embodiment of a sound production apparatus of the present invention comprises a speaker, an amplifier circuit including an electron tube, and a portable housing enclosing the speaker and containing the amplifier circuit such that the speaker is fully enclosed within the housing. A cabinet to implement the housing comprises: a front member permitting transmission of sound from the speaker in response to operating the speaker when the speaker is mounted in the cabinet; a side enclosure providing depth to the cabinet and defining a cavity therein to receive the speaker, wherein the front member is connected to the side enclosure; a first back wall member connected to the side enclosure; and a second back wall member connected to the side enclosure and located closer to the front member than is the first back wall member such that there is a space between the first back wall member and the second wall member, wherein the space is defined to receive a side wall of a chassis for completing the closure of the back of the cabinet when the chassis is mounted in the cabinet. The chassis has the amplifier circuit mounted on it.

In a particular implementation, the amplifier circuit includes: an input connector; a first triode connected to the input connector; a gain adjustment variable resistance connected to the first triode; a second triode, the second triode connected to the gain adjustment variable resistance; and a tone adjustment section which includes: a treble tone adjustment variable resistance connected to the second triode; a bass tone adjustment variable resistance connected to the second triode; and a midrange adjustment variable resistance connected to the second triode. This amplifier circuit further includes: a volume adjustment variable resistance connected to the tone adjustment section; a pentode connected to the volume adjustment variable resistance; and a transformer connected to the pentode. The triodes and the pentode preferably are mounted to the chassis such that they are on the outside of the back wall of the cabinet but the remainder of the amplifier circuit is on the inside of the back wall. Other features include particular resistors and capacitors used in the amplifier circuit to enable sufficient amplification without losing musical quality of the amplified signal.

Therefore, from the foregoing, it is a general object of the present invention to provide a novel and improved sound production apparatus. Other and further objects, features and advantages of the present invention will be readily apparent to those skilled in the art when the following description of the preferred embodiments is read in conjunction with the accompanying drawings.

BRIEF DESCRIPTION OF THE DRAWINGS

FIG. 3 is a top view of the sound production apparatus of FIG. 1.

FIG. 4 is a side sectional view along line 4—4 in FIG. 2.

FIG. 5 is a side view of a chassis of the sound production apparatus, which chassis has the tube amplifier circuit mounted on it.

FIG. 6 is a top plan view of the chassis.

FIG. 7 is a side view of the chassis opposite and inverted relative to the view of FIG. 5.

FIG. 8 is an end view along line 8—8 in FIG. 6.

DETAILED DESCRIPTION OF THE INVENTION

Figure 1:
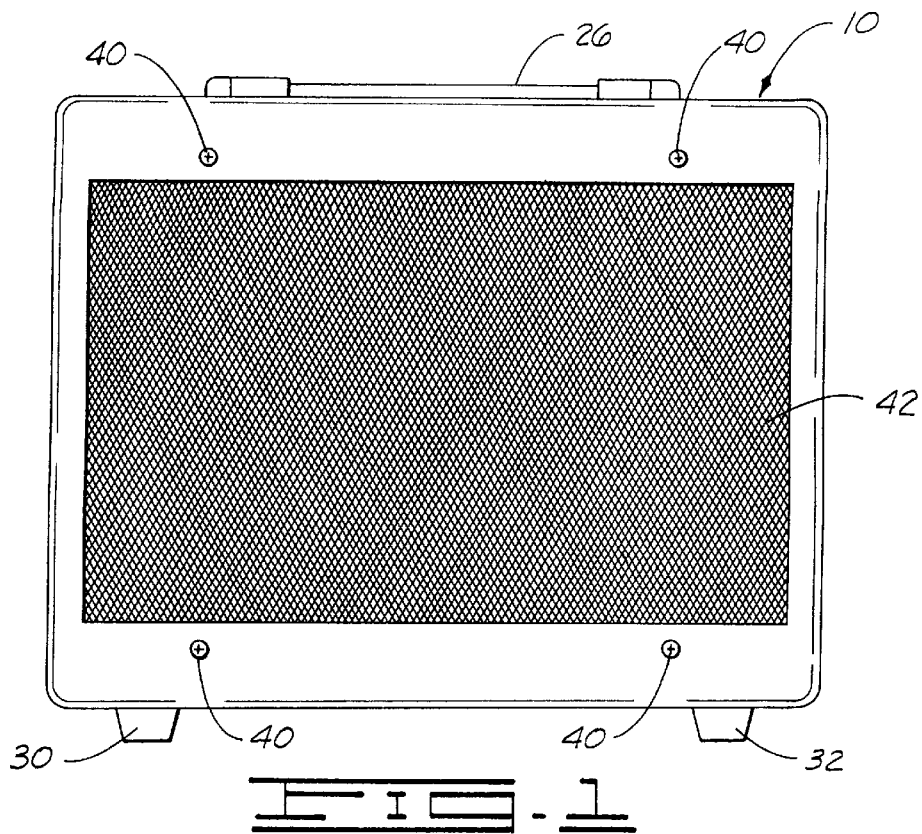
FIG. 1 is a front view of a preferred embodiment of a cabinet of the sound production apparatus of the present invention, which cabinet houses a speaker and tube amplifier circuit of the sound production apparatus.

Referring initially to FIG. 4, the sound production apparatus of the present invention comprises a speaker 2 and an amplifier circuit 4 including at least one electron tube 6 (two tubes 6a and 6b are shown in the drawings with tube 6a containing two triodes and tube 6b containing one pentode). The sound production apparatus also comprises a portable housing 8 enclosing the speaker 2 and containing the amplifier circuit 4 such that the speaker 2 is fully enclosed within the housing 8.

The speaker 2 is any suitable conventional device. A non-limiting example is a speaker having a moving voice coil of the type found in guitar amplifiers.

The amplifier circuit 4 will be further described below after the portable housing 8 is described with reference primarily to FIGS. 1–4.

The portable housing 8 includes a cabinet 10 and a chassis 12 (see, e.g., FIGS. 4 and 8). The cabinet 10 is made of a suitable material, preferably wood but other materials (e.g., plastic) can be used. The chassis 12 is also made of a suitable material, preferably metal but other materials (e.g., plastic) can also be used.

Figure 2:
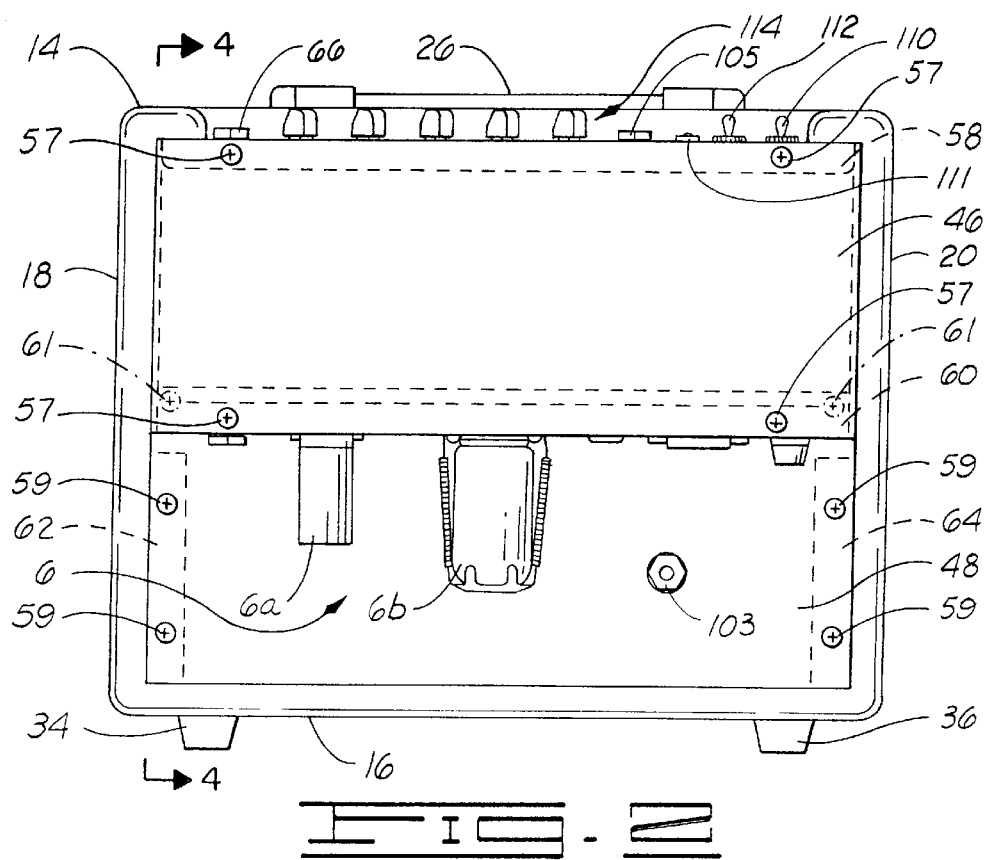
FIG. 2 is a rear view of the sound production apparatus of FIG. 1.

The cabinet 10 includes a side enclosure providing depth to the housing and defining a cavity 44 (FIG. 4) within the housing. The side enclosure includes a top 14, a bottom 16 and sides 18, 20 (FIG. 2). These four elements of the side enclosure can be integrally formed as a unitary piece or one or more pieces can be connected together. In a particular implementation each side is made of wood and these pieces are glued together and bound within an outer covering such as is conventional in guitar amplifiers (particular covering materials can include vinyl, leather, paper, or paint for example).

The top 14 has a downwardly extending front lip or flange 22 (FIG. 4). The top 14 also has a notch 24 (FIG. 3) defined in its rear edge. Connected at the middle of the top 14 is a handle 26.

The bottom 16 has an upwardly extending lip or flange 28 along the front edge of the bottom 16. Four feet 30, 32, 34, 36 are connected to the bottom 16. The bottom 16 has a greater width than does the top 14 so that the depth of the housing 8 is greater at the bottom than the top, which gives a trapezoidal side appearance, as apparent in FIG. 4. This creates an upwardly facing angle across the front of the housing 8.

Attached to the flanges 22, 28 of the side enclosure is a front member 38. Attachment is by suitable means such as screws 40 marked in FIG. 1. The front member 38 has a central aperture (not shown) defined through it. The speaker 2 is mounted to the front member 38 so that the front of the speaker 2 projects sound through the aperture in the front member 38. Thus, the front member 38 permits transmission of sound from the speaker 2 in response to operating the speaker when the speaker is mounted in the cabinet of the housing 8. A fabric grill 42 (FIG. 1) extends across the front of the front member 38. Because of the upwardly facing angle of the front of the housing 8, the sound projected from the speaker 2 is likewise angled upwardly. The front member 38 and the connected speaker 2 close the front of the housing 8 and the cavity 44 defined therein.

The rear of the cavity 44 is enclosed by a back wall means. This is disposed adjacent the amplifier circuit 4 and, although it encloses the rear of the cavity 44 and thus the speaker 2 contained therein, it exposes the electron tube(s) of the amplifier circuit 4 to air outside the housing 8.

This enclosing back wall is defined by a first back wall member 46 and a second back wall member 48, both of which are connected to the side enclosure of the cabinet 10 (FIGS. 2 and 4). This enclosing back wall means also includes the chassis 12. The two back wall members 46, 48 are connected to the side enclosure such that the member 48 is located closer to the front of the housing 8 than is the back wall member 46. This defines a space between the two members. This space is filled by the lower side wall of the chassis 12 as shown in FIG. 4.

As shown in FIGS. 2 and 4, the member 46 defines a rectangular upper back panel extending from the rear edge of the top 14 of the side enclosure. The back wall member 48 defines a rectangular lower back panel which extends upwardly from an intermediate location of the bottom 16 of the side enclosure. These two panels span the width of the rear of the cavity 44 but extend only part way across the height at the rear of the cavity 44, but sufficiently such that the lower area encompassed by the lower panel extends upwardly and the upper area encompassed by the upper panel extends downwardly sufficiently that an upper portion of the back wall member 48 overlaps a lower portion of the back wall member 46. The space defined between these overlapping portions is filled by the lower portion of the chassis 12.

The chassis 12 has an upper (as viewed in FIG. 4) side wall 50 by which the chassis 12 is connected to the top 14 with screws 52 shown in FIG. 3. A front side wall 54 of the chassis 12 extends downwardly, substantially co-planarly with the outside surface of the lower back wall panel 48, to a lower side wall 56. Side wall 56 extends perpendicularly to the back wall panels 46, 48 and closes the space between the overlapping ends of the panels 46, 48. The upper panel 46 connects to flanges 58, 60 of the chassis 12 with screws 57 marked in FIG. 2. The lower panel 48 is connected by screws 59 to support members 62, 64 attached to the bottom or sides of the side enclosure as apparent from FIGS. 2 and 4. The lower panel 48 and the chassis 12 are connected by screws 61 (FIG. 2). The front side wall 54 is perpendicular to upper side wall 50 and lower side wall 56, and the flanges 58, 60 extend perpendicularly from the side walls 50, 56, respectively. The chassis 12 spans the remaining portion of the rear of the cavity 44 not covered by the back wall panel 48.

The chassis 12 has the amplifier circuit 4 mounted on it as represented in FIG. 4 and more clearly shown in FIGS. 5–8. The preferred embodiment of the amplifier circuit 4 will be described with reference to FIGS. 9A and 9B; however, components described with reference to FIGS. 9A and 9B that also appear in FIGS. 5–8 are indicated in those drawings by the use of the same reference numerals.

Figure 9A:
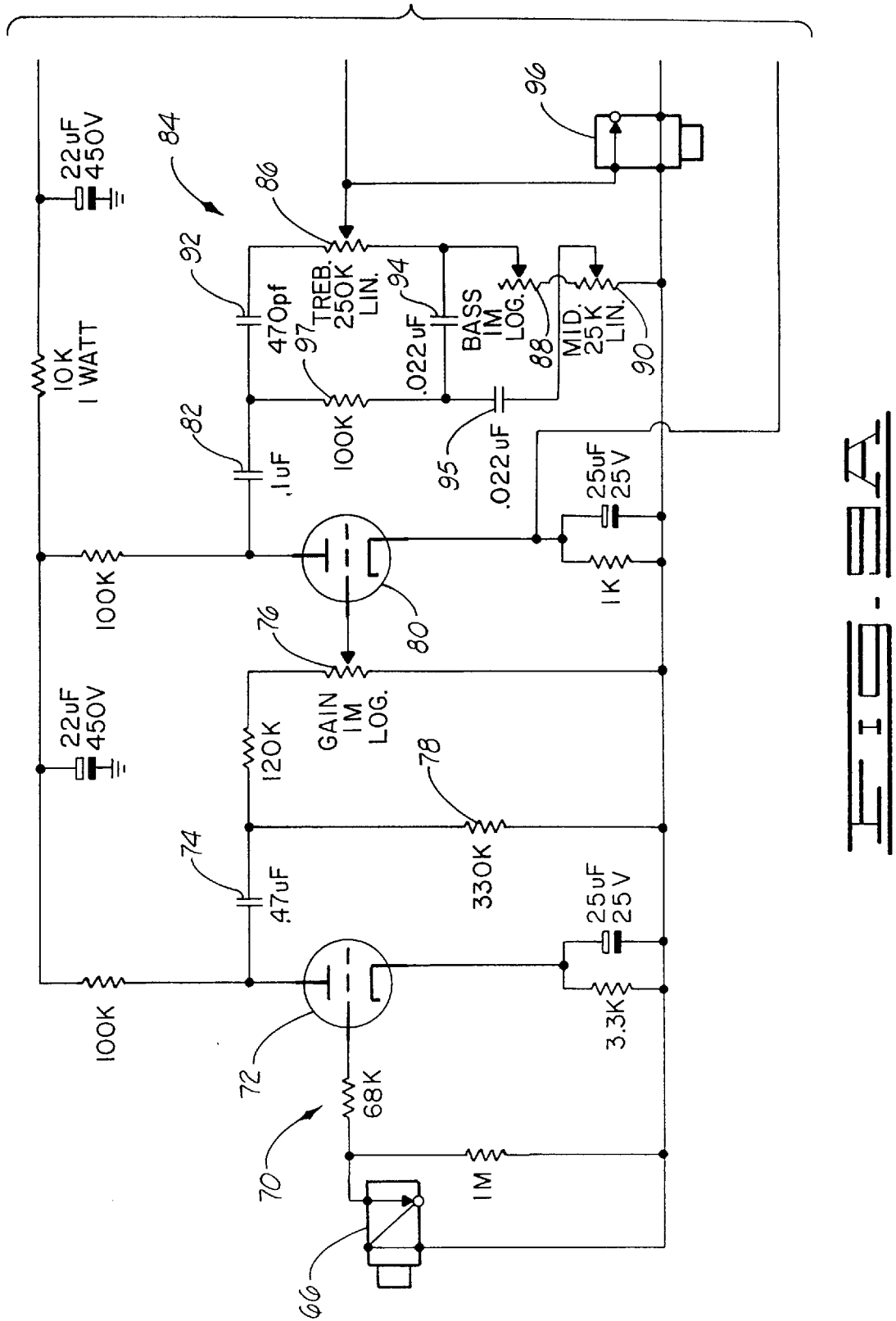
FIGS. 9A and 9B is a schematic circuit diagrams of a preferred embodiment of the tube amplifier circuit.

Referring to FIG. 9A, the amplifier circuit 4 has an input connector 66 that is specifically implemented by a jack switch that can receive, for example, a plug from the on-board circuitry of a guitar whose output is to be electrically amplified by the present invention. The input received through the connector 66 is connected through resistor network 70 to the grid or control electrode of a triode 72. The anode of the triode 72 is connected to one end of a capacitor 74 whose other end connects to a resistor network including a gain adjustment variable resistance 76 across which is connected a resistor 78. The value of the capacitor 74 is shown in FIG. 9A and is selected to filter frequencies such that a thicker tone results. Specific values of the two resistance components 76, 78 are shown in FIG. 9A, and they are selected to allow sufficient gain to be available in the circuit while retaining musical qualities of the input signal. The wiper of a potentiometer implementing the gain adjustment variable resistance 76 is connected to the control electrode of a triode 80. The triode 72 and the triode 80 are distinct but are jointly housed in a single electron tube (namely tube 6a).

The anode of the triode 80 is connected to a capacitor 82. The value of the capacitor 82 shown in FIG. 9 is selected to provide for a thicker tone. The capacitor 82 couples the signal responsive to the triode 80 to a tone adjustment section 84.

The tone adjustment section 84 includes a treble tone adjustment variable resistance 86, a bass tone adjustment variable resistance 88 and a midrange adjustment variable resistance 90, all of which are connected to the triode 80 through the capacitor 82 and other components as shown in FIG. 9. These other components include: (1) a capacitor 92 connected in series with a potentiometer implementing the treble adjustment variable resistance 86, (2) a capacitor 94 connected at one end to the potentiometer 86 and a potentiometer implementing the bass adjustment variable resistance 88; and (3) a capacitor 95 connected at one end to a potentiometer implementing the midrange adjustment variable resistance 90. A resistor 97 connects at one end to the capacitors 82, 92 and at the other end to the capacitors 94, 95. These components of the tone adjustment section 84 are selected to have the particular values shown in FIG. 9 to allow for adequate gain but without losing the bass response of the circuit.

Figures 9A, 9B:
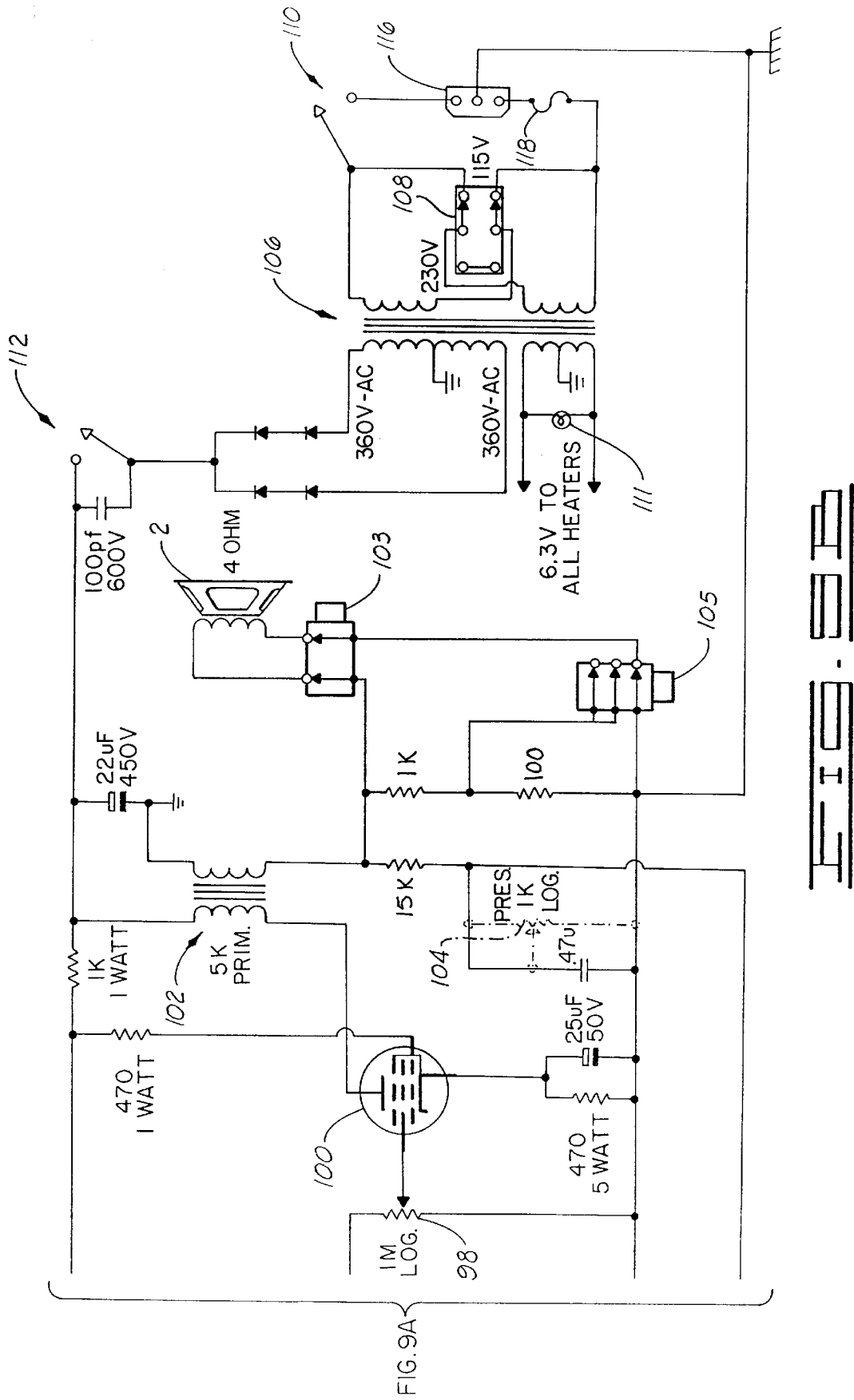

The output from the tone adjustment section 84 (obtained from the wiper of the potentiometer 86) is connected both to a preamp output jack 96 (FIG. 9A) and a volume adjustment variable resistance 98 (FIG. 9B). The wiper of the potentiometer implementing the volume adjustment variable resistance 98 is connected to the control electrode of a pentode 100 embodied in electron tube 6b shown in FIGS. 2, 4 and 6–8. The anode of the pentode 100 connects to the primary winding of a transformer 102 having a secondary winding to which the speaker 2 is connected as schematically illustrated in FIG. 9B. An output jack switch 103 is connected to the speaker 2 so that an external speaker is driven in lieu of the speaker 2 when the external speaker is plugged into the jack 103. An output jack switch 105 is connected as shown in FIG. 9B so that headphones can be driven through the jack 105 in lieu of either the speaker 2 or a speaker connected to the jack 103. That is, a plug inserted into the jack 105 disables the output through the speaker 2 and the jack 103.

The circuit shown in FIG. 9B is drawn to indicate an optional presence control. This would include a presence adjustment variable resistance 104 connected to the transformer 102 to enable manual adjustment of the feedback provided to the cathode of the triode 80.

Providing power to the circuit shown in FIGS. 9A and 9B is a transformer 106 with which a mains select switch 108, a master power on/off switch 110 and a standby switch 112 are associated as shown in FIG. 9B. A light 111 indicates when the switch 110 is closed to energize the transformer 106.

The foregoing defines a class A amplifier permitting sufficient amplification (up to ten watts for the illustrated implementation) to be obtained while maintaining the desired musical qualities of the input signal. It also permits enhanced controllability as there are at least gain control, treble control, bass control, midrange control, and volume control within the preferred embodiment shown in FIGS. 9A and 9B. These controls are effected through control knobs or members connected to the wipers of the respective potentiometers shown in FIGS. 9A and 9B. These control knobs are illustrated in FIGS. 3 and 5, for example, as collectively identified by the reference numeral 114. The control members 114 are accessible from outside the cabinet 10 as is apparent from FIG. 3 wherein these control members are located in the notch 24 of the top 14 of the housing 8. FIG. 3 also shows that the input jack 66 and the headphone jack 105 are accessible at this location as are the master power on/off and standby switches 110, 112.

Referring to FIG. 7, it is to be noted that the preamp output jack 96 is connected to the side 56 of the chassis 12 as are the electron tubes 6a, 6b. The other components shown in FIG. 7 are also mounted in this side of the chassis 12. This allows each of these to be accessible because the side 56 is the side spanning the space between the back wall members 46, 48 as shown in FIG. 4. This orientation causes the electron tubes 6 to hang vertically downward outside the enclosed cavity 44 with the remainder of the amplifier circuit 4 mounted on the chassis 12 being within the cavity 44 as also apparent from FIG. 4. This allows the electron tubes 6 to be cooled by the ambient air outside the housing 8. It also provides ready access to the preamp output jack 96, the mains selector switch 108, a power input socket 116 and a replaceable fuse 118.

Referring to FIG. 2, the external speaker jack 103 is accessible at the lower back wall panel 48.

The foregoing features are all provided within a portable cabinet which in the depicted implementation of the preferred embodiment is less than about fifteen inches wide and less than about twelve inches high and less than about eight inches deep. Yet this relatively small apparatus provides a smoother and thicker (i.e., stronger bass) sound, and a more projectional sound, due to the enclosed back. The tonality is also enhanced by the particular circuit components as described above. The musician has considerable control over this circuit and the tonality in view of the variety of manually variable components that are provided.

Thus, the present invention is well adapted to carry out the objects and attain the ends and advantages mentioned above as well as those inherent therein. While preferred embodiments of the invention have been described for the purpose of this disclosure, changes in the construction and arrangement of parts and the performance of steps can be made by those skilled in the art, which changes are encompassed within the spirit of this invention as defined by the appended claims.

What is claimed is:

1. A sound production apparatus, comprising:
    a speaker;
    an amplifier circuit including an electron tube; and
    a portable housing fully enclosing said speaker to the rear and containing part of said amplifier circuit within the enclosed space to the rear of the speaker, said portable housing including:
        a side enclosure providing depth to said housing between a front and a rear thereof and defining a cavity therein, wherein said speaker and said part of said amplifier circuit are disposed within said cavity; and
        back wall means, disposed adjacent said amplifier circuit, for enclosing the rear of said cavity but disposing said electron tube outside said back wall means relative to outside said cavity, in air outside said housing.

2. A sound production apparatus as defined in claim 1, wherein said back wall means includes:
    a first back wall member connected to said side enclosure;
    a second back wall member connected to said side enclosure and located closer to the front of said side enclosure than is said first back wall member such that there is a space between said first back wall member and said second back wall member; and
    means for filling the space between said first back wall member and said second back wall member.

3. A sound production apparatus as defined in claim 2, wherein said means for filling the space includes a chassis having said amplifier circuit mounted thereon.

4. A sound production apparatus as defined in claim 3, wherein said back wall means includes:
    a back wall member connected to said side enclosure and extending part way across the rear of said cavity; and
    a chassis connected to said side enclosure and extending across at least the remainder of the rear of said cavity, said chassis having said amplifier circuit mounted thereon.

5. A sound production apparatus as defined in claim 4, wherein said back wall means further includes another back wall member connected to said chassis.

6. A sound production apparatus as defined in claim 5, wherein said amplifier circuit is a class A guitar amplifier.

7. A cabinet for a sound production apparatus having a speaker and an amplifier circuit connected to the speaker and mounted on a chassis, said cabinet comprising:
- a front member permitting transmission of sound from the speaker in response to operating the speaker when the speaker is mounted in said cabinet;
- a side enclosure providing depth to said cabinet and defining a cavity therein to receive the speaker, wherein said front member is connected to said side enclosure;
- a first back wall member connected to said side enclosure; and
- a second back wall member connected to said side enclosure and located closer to said front member than is said first back wall member such that there is a space between said first back wall member and said second wall member, wherein said space is defined to receive a side wall of the chassis for completing the closure of the back of said cabinet when the chassis is mounted in said cabinet.

8. A cabinet as defined in claim 7, wherein:
- said first back wall member is disposed across an upper area of the back of said cabinet; and
- said second back wall member is disposed across a lower area of the back of said cabinet, said lower area extending upwardly and said upper area extending downwardly sufficiently such that an upper portion of said second back wall member overlaps a lower portion of said first back wall member with said space defined between said overlapping portions.

9. A sound production apparatus comprising an amplifier circuit including:
- an input connector;
- a first triode connected to said input connector;
- a gain adjustment variable resistance connected to said first triode;
- a second triode, said second triode connected to said gain adjustment variable resistance;
- a tone adjustment section including:
  - a treble tone adjustment variable resistance connected to said second triode;
  - a bass tone adjustment variable resistance connected to said second triode; and
  - a midrange adjustment variable resistance connected to said second triode;
- a volume adjustment variable resistance connected to said tone adjustment section;
- a pentode connected to said volume adjustment variable resistance; and
- a transformer connected to said pentode.

10. A sound production apparatus as defined in claim 9, further comprising:
- a chassis having said amplifier circuit mounted thereon;
- a speaker connected to said transformer; and
- a cabinet having said speaker connected thereto and further having said chassis connected thereto forming part of a back wall enclosing the rear of said cabinet.

11. A sound production apparatus as defined in claim 10, wherein said variable resistances each have respective control members connected thereto such that said control members are accessible from outside said cabinet.

12. A sound production apparatus as defined in claim 11, wherein said amplifier circuit further includes a presence adjustment variable resistance connected to said transformer and having a control member connected thereto such that said control member connected to said presence adjustment variable resistance is accessible from outside said cabinet.

13. A sound production apparatus as defined in claim 12, wherein said amplifier circuit further includes an output jack connected to said tone adjustment section and disposed such that said output jack is accessible from outside said cabinet.

14. A sound production apparatus as defined in claim 13, wherein said triodes and said pentode are mounted to said chassis such that said triodes and said pentode are on the outside of said back wall of said cabinet but the remainder of said amplifier circuit is on the inside of said back wall.

15. A sound production apparatus as defined in claim 14, wherein:
- said gain adjustment variable resistance includes a first potentiometer, said first potentiometer having a maximum resistance of about 1,000,000 ohms;
- said treble tone adjustment resistance includes a second potentiometer, said second potentiometer having a maximum resistance of about 250,000 ohms;
- said bass tone adjustment variable resistance includes a third potentiometer, said third potentiometer having a maximum resistance of about 1,000,000 ohms;
- said midrange adjustment variable resistance includes a fourth potentiometer, said fourth potentiometer having a maximum resistance of about 25,000 ohms;
- said tone adjustment section further includes:
  - a first capacitor, said first capacitor having a capacitance of about 470 picofarads and said first capacitor connected to said second potentiometer;
  - a second capacitor, said second capacitor having a capacitance of about 0.022 microfarads and said second capacitor connected to said second potentiometer and said third potentiometer;
  - a third capacitor, said third capacitor having a capacitance of about 0.022 microfarads and said third capacitor connected to said fourth potentiometer; and
  - a first resistor, said first resistor having a resistance of about 100,000 ohms, said first resistor connected to said first capacitor and to said second and third capacitors; and
- said amplifier circuit further includes a second resistor, said second resistor having a resistance of about 330,000 ohms and said second resistor connected to said first potentiometer.

16. A sound production apparatus as defined in claim 15, wherein said amplifier circuit further includes:
- a fourth capacitor, said fourth capacitor having a capacitance of about 0.47 microfarads and said fourth capacitor connected to said first triode and said second resistor; and
- a fifth capacitor, said fifth capacitor having a capacitance of about 0.1 microfarads and said fifth capacitor connected to said second triode and to said first resistor and said first capacitor.

* * * * *

UNITED STATES PATENT AND TRADEMARK OFFICE
CERTIFICATE OF CORRECTION

Patent No.: 6,111,968
Dated: August 29, 2000
Inventor(s): John T. Riboloff

It is certified that errors appear in the above-identified patent and that said Letters Patent is hereby corrected as shown below:

Column 6, line 44, delete "outside".

Column 6, line 60, delete "3" and insert --1-- therefor.

Column 7, line 4, delete "5" and insert --1-- therefor.

Column 8, line 9, delete "12" and insert --11-- therefor.

Column 8, line 13, delete "13" and insert --10-- therefor

Column 8, line 18, delete "14" and insert --9-- therefor.

Signed and Sealed this

Eighth Day of May, 2001

*Attest:*

NICHOLAS P. GODICI

*Attesting Officer*     *Acting Director of the United States Patent and Trademark Office*